(12) United States Patent
Nallamothu

(10) Patent No.: US 9,893,688 B1
(45) Date of Patent: Feb. 13, 2018

(54) OFFSET CALIBRATION CIRCUIT AND METHOD FOR AN AMPLIFIER CIRCUIT

(71) Applicant: STMicroelectronics, Inc., Coppell, TX (US)

(72) Inventor: Pavan Nallamothu, Little Elm, TX (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 15/299,527

(22) Filed: Oct. 21, 2016

(51) Int. Cl.
  *H03F 1/02* (2006.01)
  *H03F 3/45* (2006.01)
  *H03F 1/34* (2006.01)

(52) U.S. Cl.
  CPC ......... *H03F 3/45219* (2013.01); *H03F 1/342* (2013.01); *H03F 2200/411* (2013.01); *H03F 2203/45048* (2013.01); *H03F 2203/45212* (2013.01)

(58) Field of Classification Search
  CPC ............... H03F 1/02; H03F 3/005; H03F 3/45
  USPC .................................................. 330/9, 259, 2
  See application file for complete search history.

(56) References Cited

U.S. PATENT DOCUMENTS

2006/0186954 A1* 8/2006 Koller ....................... H03F 1/34
  330/9

* cited by examiner

*Primary Examiner* — Steven J Mottola
(74) *Attorney, Agent, or Firm* — Gardere Wynne Sewell LLP

(57) ABSTRACT

A differential amplifier has an inherent offset voltage. In many circuit applications, such as with a voltage to current converter circuit, it is important to nullify that offset voltage. A calibration circuit is provided to configured the differential amplifier to operate as a comparator with a common voltage applied to both inputs. The logic state of the output of the amplifier indicates whether the offset voltage is positive or negative. In response thereto, a trim current with a progressively increasing magnitude is injected into the amplifier and the amplifier output is monitored to detect a change in logic state. The magnitude of the trim current at the point where the logic state changes is the magnitude of trim current needed to nullify the voltage offset.

32 Claims, 4 Drawing Sheets

OFFSET CALIBRATION CIRCUIT AND METHOD FOR AN AMPLIFIER CIRCUIT

TECHNICAL FIELD

The present invention relates to amplifier circuit and, in particular, to an offset calibration circuit for such an amplifier circuit.

BACKGROUND

FIG. 1 shows a circuit diagram for a conventional voltage to current generator circuit 10. A differential amplifier circuit 12 has a non-inverting input (+) that receives an input voltage Vin. The inverting input of the differential amplifier circuit 12 receives a feedback voltage Vfb. The output of the differential amplifier circuit 12 drives the control terminal (gate) of an n-channel transistor 14. A first conduction terminal (source) of the transistor 14 is connected in a feedback path 16 to the inverting input of the differential amplifier circuit 12. A resistor 18 is coupled between the source of transistor 14 and a ground node. A second conduction terminal (drain) of the transistor 14 is coupled to an intermediate node 20. A current mirror circuit 22 includes a first p-channel transistor 24 and a second p-channel transistor 26. The first p-channel transistor 24 has a first conduction terminal (source) coupled to a supply voltage node Vdd. The second conduction terminal (drain) of transistor 24 is coupled to the intermediate node 20 and further connected to the control terminal (gate) of the transistor 24. Transistor 24 is accordingly a diode-connected device. The second p-channel transistor 26 has a first conduction terminal (source) coupled to the supply voltage node Vdd. A control terminal (gate) of the transistor 26 is coupled to the gate of the transistor 24. The second conduction terminal (drain) of transistor 26 outputs a current Iout having a magnitude that is dependent on the input voltage Vin.

The current through transistor 14 is sensed by the resistor 18 to generate the feedback voltage Vfb. The output of the differential amplifier 12 is the difference between the input voltage Vi and the feedback voltage Vfb. This difference voltage Vdiff is applied to the control terminal of transistor 14. In response to the negative feedback through feedback path 16, the differential amplifier 12 will drive the transistor 14 so that the feedback voltage Vfb equals the input voltage Vi. The current through transistor 14 is mirrored by the current mirror circuit 22 to generate the current Iout. The magnitude of the current Iout is set as a function of the input voltage Vin, the resistance of resistor 18 and the mirror ratio of transistors 24 and 26.

There is an offset associated with the operation of the differential amplifier 12. This offset will affect magnitude of the current Iout and thus introduces an error in the voltage to current conversion operation. There is a need in the art to address the voltage offset in order to ensure accurate operation of the voltage to current converter. More generally, for any amplifier circuit that suffers from a voltage offset, there is a need in the art to correct for that offset. Embodiments herein address that need.

SUMMARY

In an embodiment, a circuit comprises: a differential amplifier having a first input, a second input and an output; and a calibration circuit configured to compensate for an offset voltage of the differential amplifier. The calibration circuit comprises: a shorting circuit configured to short the first and second inputs together and apply a calibration voltage to both the first and second inputs; wherein said differential amplifier outputs a digital signal in response to the applied calibration voltage having a logic state indicating whether said offset voltage is a positive or negative offset voltage; and an offset cancellation circuit receiving the digital signal and configured to progressively increment a magnitude of a first trim current applied to the differential amplifier to reduce the positive offset voltage if the digital signal has a first logic state and progressively increment a magnitude of a second trim current applied to the differential amplifier to reduce the negative offset voltage if the digital signal has a second logic state.

In an embodiment, a method comprises: shorting together a first and second inputs of a differential amplifier; applying a calibration voltage to both the first and second inputs; detecting a logic state of a digital signal generated at an output of the differential amplifier in response to the applied calibration voltage, said logic state indicating whether an offset voltage of the differential amplifier is a positive or negative offset voltage; if the digital signal has a first logic state, then progressively incrementing a magnitude of a first trim current applied to the differential amplifier to reduce the positive offset voltage; and if the digital signal has a second logic state, then progressively incrementing a magnitude of a second trim current applied to the differential amplifier to reduce the negative offset voltage.

In an embodiment, a circuit comprises: a differential amplifier having a first input, a second input and an output; a transistor having a control terminal and a conduction terminal; a feedback path coupled between the conduction terminal and the second input; a first transistor switch coupled between the first and second inputs; a second transistor switch coupled between the feedback path and the second input; and a calibration circuit. The calibration circuit is configured to: turn on said first transistor switch and turn off said second transistor switch in a calibration mode; apply a calibration voltage to both the first and second inputs, said differential amplifier outputs a digital signal in response to the applied calibration voltage having a logic state indicating whether said offset voltage is a positive or negative offset voltage; progressively increment a magnitude of a first trim current applied to the differential amplifier to reduce the positive offset voltage if the digital signal has a first logic state; and progressively increment a magnitude of a second trim current applied to the differential amplifier to reduce the negative offset voltage if the digital signal has a second logic state.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 2:
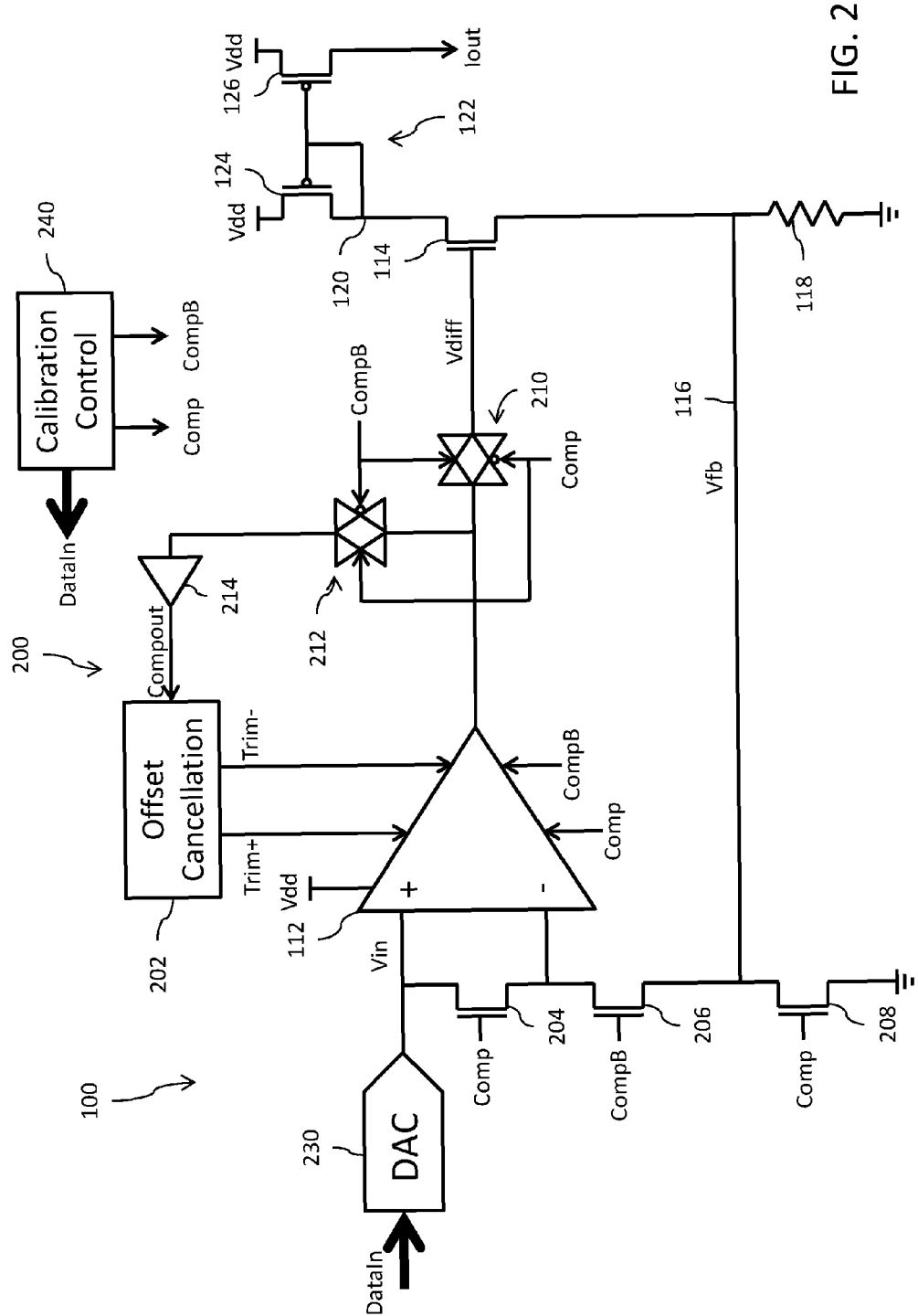
FIG. 2 is a circuit diagram for a voltage to current generator circuit including a voltage offset calibration circuit.

Reference is now made to FIG. 2 showing a circuit diagram for a voltage to current generator circuit 100 including a voltage offset calibration circuit 200 acting on the included high gain differential amplifier circuit 112. The high gain differential amplifier circuit 112 has a non-inverting input (+) that receives an input voltage Vin. The inverting input of the differential amplifier circuit 112 selectively receives one of: a) a feedback voltage Vfb when the differential amplifier circuit 112 is operating in a differential mode during normal voltage to current conversion operation, or b) the input voltage Vin when the differential amplifier circuit 112 is operating in comparator mode during a calibration operation.

A control (gate) terminal of transistor 114 is selectively coupled to the output of the differential amplifier circuit 112 during the normal voltage to current conversion operation. A first conduction terminal (source) of the transistor 114 is coupled in a feedback path 116 to the inverting input of the differential amplifier circuit 112. A resistor 118 is coupled between the source of transistor 114 and a ground node. A second conduction terminal (drain) of the transistor 114 is coupled to an intermediate node 120. A current mirror circuit 122 includes a first p-channel transistor 124 and a second p-channel transistor 126. The first p-channel transistor 124 has a first conduction terminal (source) coupled to a supply voltage node Vdd. The second conduction terminal (drain) of transistor 124 is coupled to the intermediate node 120 and further connected to the control terminal (gate) of the transistor 124. Transistor 124 is accordingly a diode-connected device. The second p-channel transistor 126 has a first conduction terminal (source) coupled to the supply voltage node Vdd. A control terminal (gate) of the transistor 126 is coupled to the gate of the transistor 124. The second conduction terminal (drain) of transistor 126 outputs a current Iout having a magnitude that is dependent on the input voltage Vin.

The offset calibration circuit 200 includes a calibration control circuit 240 that generates comparator control signals Comp and CompB to select the operational mode between normal voltage to current conversion operation and calibration operation. When Comp is logic low and CompB is logic high, the differential amplifier circuit 112 operates in the differential mode to support the normal voltage to current conversion operation. In the differential mode, the output of the differential amplifier circuit 112 drives the control terminal (gate) of an n-channel transistor 114 with a voltage that is equal to an amplified difference (Vdiff) between the voltages received at the inverting and non-inverting inputs (– and +). Conversely, when CompB is logic low and Comp is logic high, the differential amplifier circuit 112 operates in the comparator mode to support the calibration operation. In the comparator mode of the operation, the input voltage Vin is applied to both the inverting input (–) and the non-inverting input (+), and the output of the differential amplifier circuit 112 is a digital signal (Compout) having one of two logic states dependent on the positive/negative voltage offset within the differential amplifier circuit 112.

An offset cancellation circuit 202 is configured to generate first and second trim currents (Trim– and Trim+) for canceling the voltage offset within the differential amplifier circuit 112. The offset calibration circuit 200 controls the application of the first and second trim currents to the differential amplifier circuit 112 in response to the logic state of the comparator output signal (Compout). Generation of the comparator output signal will be described in more detail herein. The offset calibration circuit 200 further controls setting of the magnitude of the applied first/second trim current.

An n-channel transistor 204 has a first conduction terminal (source) coupled to the inverting input (–) of the circuit 112 and a second conduction terminal (drain) coupled to the non-inverting input (+). A control terminal (gate) of the transistor 204 receives the comparator control signal Comp. In response to assertion (for example, logic high) of the comparator control signal Comp during the calibration operation, the transistor 204 is turned on to shunt (i.e., short-circuit) the inverting input (–) to the non-inverting input (+). In this circuit configuration, the input voltage Vin is applied to both the inverting input (–) and the non-inverting input (+) of the differential amplifier circuit 112.

An n-channel transistor 206 has a first conduction terminal (source) coupled to the feedback path 116 and a second conduction terminal (drain) coupled to the inverting input (–) of the circuit 112. A control terminal (gate) of the transistor 206 receives the comparator control signal CompB. In response to assertion (for example, logic high) of the comparator control signal CompB during the normal voltage to current conversion operation, the transistor 206 is turned on to shunt (i.e., short-circuit) the inverting input (–) to source of transistor 114 through the feedback path 116.

An n-channel transistor 208 has a first conduction terminal (source) coupled to the ground node and a second conduction terminal (drain) coupled to the feedback path 116. A control terminal (gate) of the transistor 208 receives the comparator control signal Comp. In response to assertion (for example, logic high) of the comparator control signal Comp during the calibration operation, the transistor 208 is turned on to shunt (i.e., short-circuit) the source of transistor 114 through the feedback path 116 to ground.

A first CMOS transmission gate circuit 210 is coupled between the output of the amplifier circuit 112 and the gate terminal of transistor 114. The first CMOS transmission gate circuit 210 is controlled by the comparator control signals Comp and CompB. When Comp is logic low and CompB is logic high during the normal voltage to current conversion operation, the first CMOS transmission gate circuit 210 is turned on and the output of the amplifier circuit 112 will drive the gate of transistor 114 with the signal Vdiff. Conversely, when CompB is logic low and Comp is logic high during the calibration operation, the first CMOS transmission gate circuit 210 is turned off to disconnect the gate of transistor 114 from the amplifier 112.

A second CMOS transmission gate circuit 212 is coupled between the output of the amplifier circuit 112 and the offset calibration circuit 200. The second CMOS transmission gate circuit 212 is also controlled by the comparator control signals Comp and CompB. When Comp is logic low and CompB is logic high during the normal voltage to current conversion operation, the second CMOS transmission gate circuit 212 is turned off to disconnect the offset cancellation circuit 202 from the amplifier 112. Conversely, when CompB is logic low and Comp is logic high during the calibration operation, the second CMOS transmission gate circuit 212 is turned on and the output of the amplifier circuit 112 is applied to the offset cancellation circuit 202 as the comparator output signal (Compout) through a buffer circuit 214.

A digital-to-analog converter (DAC) circuit 230 receives a multi-bit digital data signal (DataIn) and converts that signal to an analog input voltage Vin that is applied at least to the non-inverting input (+) of the amplifier circuit 112. When operating in connection with the normal voltage to current conversion operation, the circuit 100 converts the input voltage Vin to the output current Iout. When operating in connection with the calibration operation, the calibration control circuit 240 generates the multi-bit digital data signal DataIn and the corresponding converted input voltage Vin is then an input calibration voltage.

Figure 5A:
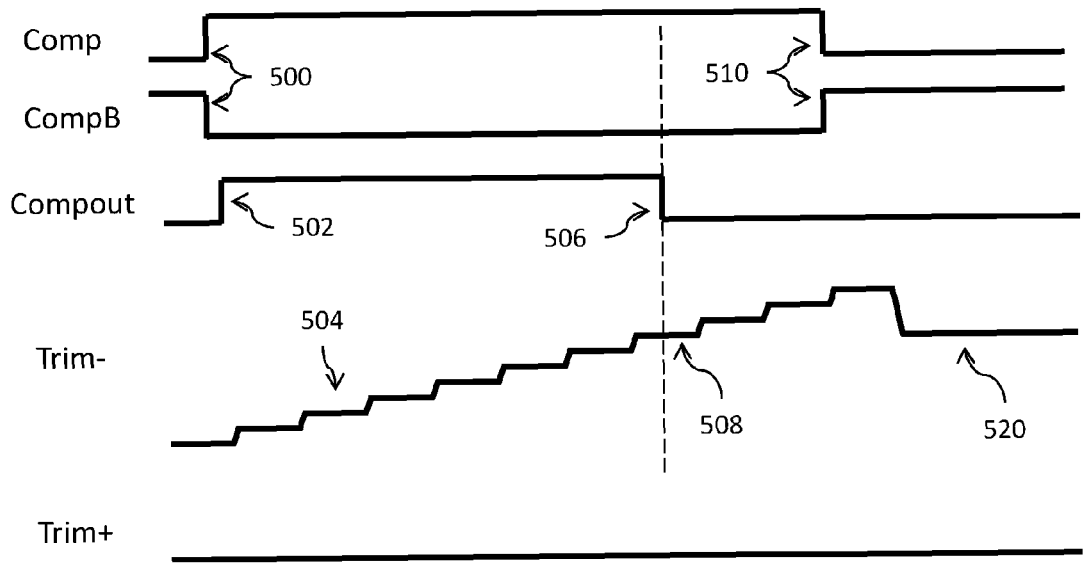
FIGS. 5A-5B are timing diagrams illustrating circuit operation.
Figure 5B:
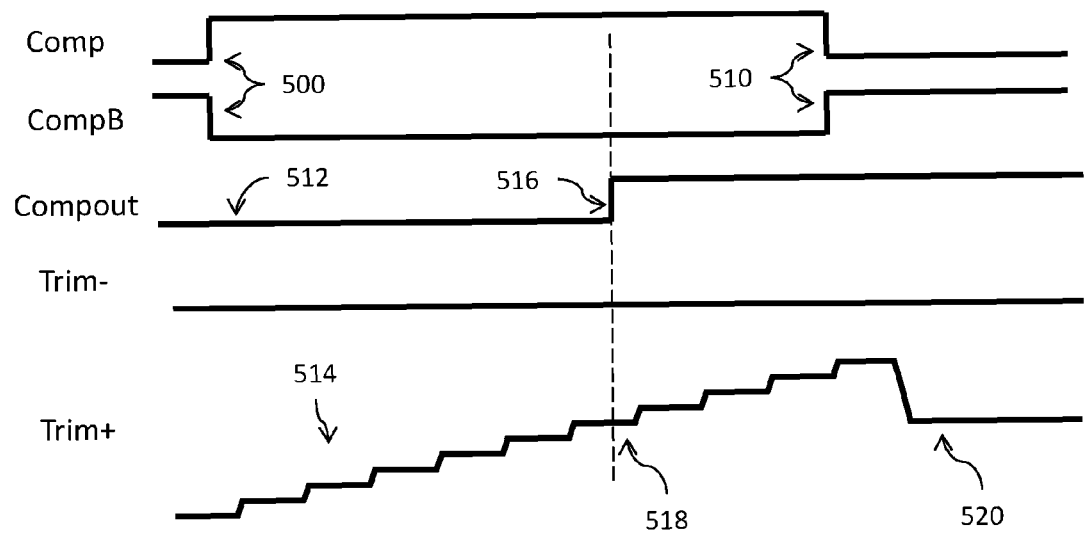

Operation of the circuit 100 is as follows:

When in the calibration mode of operation, CompB is logic low and Comp is logic high (FIGS. 5A-5B, reference 500). The transistors 204 and 208 are turned on, the transistor 206 is turned off, the first CMOS transmission gate circuit 210 is turned off and the second CMOS transmission gate circuit 212 is turned on. The calibration control circuit 240 sets a value for DataIn so that the DAC circuit 230 generates a certain magnitude for the input voltage Vin to provide the input calibration voltage. Due to the short circuit (shunt) provided by transistor 204, that input calibration Vin is applied to both the inverting input (−) and the non-inverting input (+) of the amplifier circuit 112.

Due to the high gain configuration of the amplifier circuit 112 and with the feedback path from the output of the amplifier circuit 112 through transistor 114 to the inverting input (−) disconnected by transistor 206, the amplifier circuit 112 will operate in the comparator mode. Because the same input calibration voltage Vin is applied to both the inverting input and the non-inverting input, the output of the amplifier circuit 112 is the comparator output signal (Compout) having a logic state is dependent on the positive/negative voltage offset present within the amplifier circuit 112.

If the comparator output signal (Compout) has a first logic state (FIG. 5A, reference 502), this indicates that the differential amplifier circuit 112 has a positive voltage offset. In response thereto, the offset cancellation circuit 202 will progressively increase (FIG. 5A, reference 504) the magnitude of the first trim current (Trim−) and monitor the comparator output signal (Compout) for a change in logic state (FIG. 5A, reference 506). The change in logic state of the comparator output signal (Compout) indicates that a sufficient amount of the first trim current (Trim−) has been injected into the amplifier circuit 112 to reduce and effectively correct for the positive voltage offset. The magnitude (FIG. 5A, reference 508) of that sufficient amount of first trim current (Trim−) is saved by the offset cancellation circuit 202 for later application to the amplifier circuit 112 in the normal voltage to current conversion operation.

Conversely, if the comparator output signal (Compout) has the second logic state (FIG. 5B, reference 512), this indicates that the differential amplifier circuit 112 has a negative voltage offset. In response thereto, the offset cancellation circuit 202 will progressively increase (FIG. 5B, reference 514) the magnitude of the second trim current (Trim+) and monitor the comparator output signal (Compout) for a change in logic state (FIG. 5B, reference 516). The change in logic state of the comparator output signal (Compout) indicates that a sufficient amount of the second trim current (Trim+) has been injected into the amplifier circuit 112 to effectively reduce and correct for the negative voltage offset. The magnitude (FIG. 5B, reference 518) of that sufficient amount of second trim current (Trim+) is saved by the offset cancellation circuit 202 for later application to the amplifier circuit 112 in the normal voltage to current conversion operation.

Following detection of the change in logic state of the comparator output signal (Compout), the calibration operation of the circuit 202 is terminated. CompB is set at logic high and Comp is set at logic low (FIGS. 5A-5B, reference 510) to set the circuit for normal voltage to current conversion operation. The transistors 204 and 208 are turned off, the transistor 206 is turned on, the first CMOS transmission gate circuit 210 is turned on and the second CMOS transmission gate circuit 212 is turned off. With the feedback loop reconnected by transistor 206 and the first CMOS transmission gate circuit 210, the differential amplifier circuit 112 is now configured for the differential mode. The voltage to current generator circuit 100 now operates to convert the received input voltage Vin to the output current Iout. While in normal voltage to current conversion operation, the offset cancellation circuit 202 will apply the saved magnitude (reference 508 and 518) of the first or second trim current (Trim− or Trim+) to the amplifier circuit 112 so that the voltage offset is nullified (FIGS. 5A-5B, reference 520).

In an embodiment, the calibration control circuit 240 may be enabled for calibration operation in response to start-up of the integrated circuit which includes the voltage to current generator circuit 100.

Figure 3:
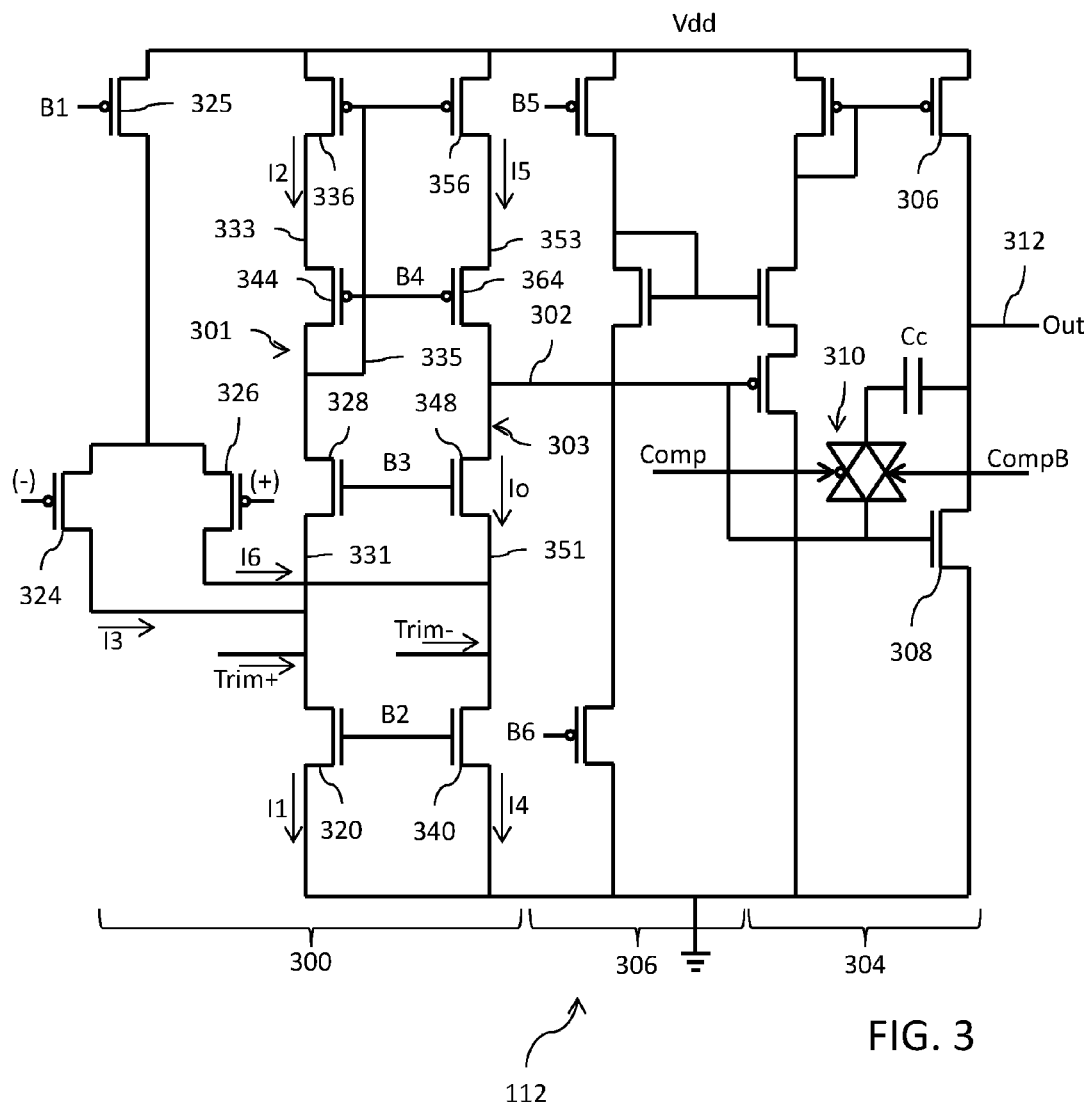
FIG. 3 is a circuit diagram for the differential amplifier used in FIG. 2.

Reference is now made to FIG. 3 showing a circuit diagram of the differential amplifier circuit 112. The amplifier circuit 112 is a two-stage amplifier. The first stage 300 has a folded cascode configuration with a differential input (+ and −) and a single ended output 302. The second stage 304 implements a high gain push-pull output formed by p-channel transistor 306 and n-channel transistor 308. A bias circuit 306 responsive to bias voltages B5 and B6 provides bias for the high gain operation of the second stage 304.

The second stage 304 includes a CMOS transmission gate circuit 310 coupled in series with a compensation capacitor Cc between the single ended output 312 of the second stage 304 and the single ended output 302 of the first stage 300. The CMOS transmission gate circuit 310 is controlled by the comparator control signals Comp and CompB. When Comp is logic low and CompB is logic high during the normal voltage to current conversion operation, the CMOS transmission gate circuit 310 is turned on and the compensation capacitor is connected. The amplifier circuit 112 operates in the differential mode to generate the output Vdiff. Conversely, when CompB is logic low and Comp is logic high during the calibration operation, the CMOS transmission gate circuit 310 is turned off and the compensation capacitor is disconnected. The amplifier circuit 112 now operates in the comparator mode to generate the output Compout with the p-channel transistor 306 and n-channel transistor 308 driving the output voltage to the Vdd and ground rails, respectively, dependent on the positive/negative voltage offset present within the first stage 300 of the amplifier circuit 112.

The folded cascode design of the first stage 300 includes a differential pair of p-channel input transistors 324 and 326 coupled to a p-channel tail current source transistor 325 biased by a bias voltage B1. A first circuit leg 301 in the cascode circuit includes a plurality of transistors having source-drain paths coupled in series between the supply voltage Vdd node and ground. The first circuit leg 301 includes a first n-channel current source transistor 320 having a source terminal connected to ground and a control terminal connected to receive a bias voltage B2. The drain terminal of transistor 320 is connected at node 331 to the drain terminal of transistor 324. A first n-channel cascode transistor 328 has a source terminal connected to node 331 and a gate terminal that is connected to receive a bias voltage B3. The first circuit leg 301 further includes a first p-channel current source transistor 336 having a source terminal connected to the supply voltage Vdd node and a drain terminal connected to node 333. A first p-channel cascode transistor 344 has a source terminal connected to node 333 and a gate terminal that is connected to receive a bias voltage B4. The drains of transistors 328 and 344 are connected together at node 335, and the gate terminal of transistor 336 is also connected to node 335.

The folded cascode design of the first stage 300 further includes a second circuit leg 303 including a plurality of transistors having source-drain paths coupled in series between the supply voltage Vdd node and ground. The second circuit leg 303 in the cascode circuit includes a second n-channel current source transistor 340 having a source terminal connected to ground and a control terminal connected to receive the bias voltage B2. The drain terminal of transistor 340 is connected at node 351 to the drain terminal of transistor 322. A second n-channel cascode transistor 348 has a source terminal connected to node 351 and a gate terminal that is connected to receive the bias voltage B3. The second circuit leg 303 further includes a second p-channel current source transistor 356 having a source terminal connected to the supply voltage Vdd node and a drain terminal connected to node 353. A second p-channel cascode transistor 364 has a source terminal connected to node 353 and a gate terminal that is connected to receive the bias voltage B4. The drains of transistors 348 and 364 are connected together at the single ended output node 302.

The trim currents Trim+ and Trim− output from the offset cancellation circuit 202 are applied to the first circuit leg 301 and second circuit leg 303, respectively, in the folded cascode stage 300. More particularly, the trim currents Trim+ and Trim− are applied to the nodes 331 and 351, respectively.

In the first circuit leg 301, the first n-channel current source transistor 320 sinks a first current I1 from node 331 in response to the bias B2. The first p-channel current source transistor 336 sources a second current I2 into node 331. Node 331 further receives the trim current Trim+ and the current I3 from transistor 324. Thus, the current I1 is equal to the sum of the currents I2, I3 and Itrim+.

In the second circuit leg 303, the second n-channel current source transistor 340 sinks a fourth current I4 from node 351 in response to the bias B2. The second p-channel current source transistor 356 sources a fifth current I5 into node 331. Node 351 further receives the trim current Trim− and the current I6 from transistor 326. Thus, the current I4 is equal to the sum of the currents I5, I6 and Itrim−. The current through transistor 348 is referred to as the current Io.

In an ideal case, with no voltage offset present in the amplifier, the currents flowing in the legs 301 and 303 should be equal when the same input calibration voltage Vin is applied to both the inverting input (−) and the non-inverting input (+). However, because of the voltage offset, these currents will not be equal and as a result of operation in the comparator mode the comparator output signal (Compout) will have a logic state that is dependent on the positive/negative voltage offset. For example, the comparator output signal (Compout) may be logic low when the current I5 is more than the current Io (indicating presence of a negative offset voltage) and alternatively may be logic high when the current I5 is less than the current in Io (indicating a positive offset voltage).

In calibration operation, the offset cancellation circuit 202 responds to the logic high state of the comparator output signal (Compout) by increasing the trim current Trim− so as to decrease the current Io (FIG. 5A). Conversely, the offset cancellation circuit 202 responds to the logic low state of the comparator output signal (Compout) by increasing the trim current Trim+ so as to decrease the current I5 (FIG. 5B). With an appropriate adjustment in leg current, the voltage offset is reduced and even eliminated. The offset cancellation circuit 202 detects that a sufficient amount of trim current has been supplied when the logic state of the comparator output signal (Compout) changes.

Figure 1:
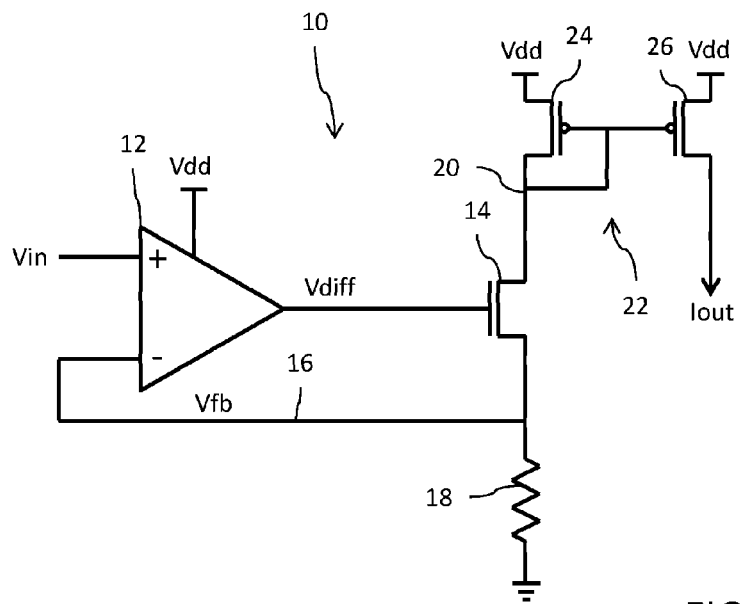
FIG. 1 is a circuit diagram for a conventional voltage to current generator circuit.
Figure 4:
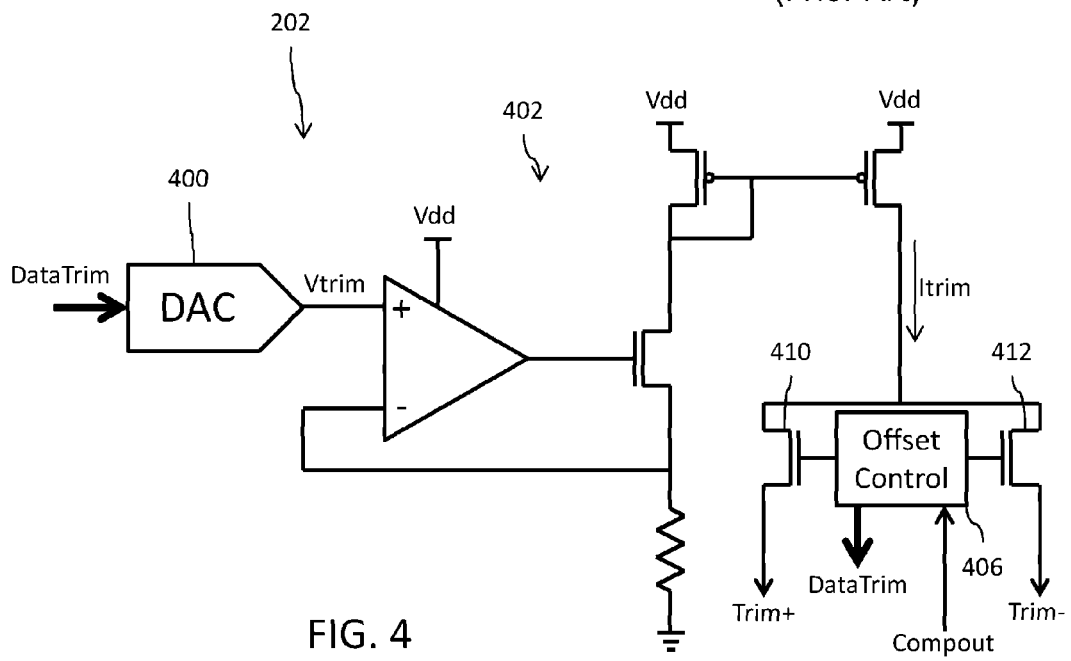
FIG. 4 is a circuit diagram for the offset cancellation circuit used in FIG. 2.

FIG. 4 shows a circuit diagram of the offset cancellation circuit 202. A digital-to-analog converter (DAC) circuit 400 receives a multi-bit digital trimming signal (DataTrim) and converts that digital signal to an analog trim voltage Vtrim. A voltage-to-current converter circuit 402 (like that shown at reference 10 in FIG. 1) converts the analog trim voltage Vtrim to a trim current Itrim. The configuration and operation of the circuit 402 will not be described in detail. Reference is made to the discussion of FIG. 1. The multi-bit digital trimming signal (DataTrim) is generated by an offset control circuit 406. At the start of the calibration operation (FIGS. 5A-5B, reference 500), the offset control circuit 406 sets the multi-bit digital trimming signal (DataTrim) to an initial digital value. In an embodiment, that initial digital value may, for example, be zero. An initial analog trim voltage Vtrim(init) corresponding to the initial digital value of the multi-bit digital trimming signal (DataTrim) is generated by the DAC circuit 400 and converted by the circuit 402 to an initial trim current Itrim(init).

In response to the logic state of the comparator output signal (Compout) (FIGS. 5A-5B, references 502 and 512), the offset control circuit 406 selects and turns on one of the n-channel switch transistors 410 and 412 by applying an appropriate gate voltage. The switch transistors 410 and 412 function as a current steering circuit to steer the trim current Itrim for output as one or the other of the first and second trim currents (Trim− or Trim+). If, for example, the comparator output signal (Compout) is logic high, the offset control circuit 406 may select and turn on switch transistor 412 to output the trim current Itrim as the first trim current Trim− (FIG. 5A). Conversely, if the comparator output signal (Compout) is logic low, the offset control circuit 406 may select and turn on switch transistor 410 to output the trim current Itrim as the second trim current Trim+ (FIG. 5B).

After selectively actuating one of the switch transistors 410 and 412, the offset control circuit 406 increments the digital value of the multi-bit digital trimming signal (DataTrim). This results in a corresponding increase in the analog trim voltage Vtrim along with a corresponding increase in the trim current Itrim. That trim current Itrim is applied to the amplifier circuit 112 through one of the first and second trim currents (Trim− or Trim+) to adjust the current flowing the corresponding cascode circuit leg and reduce the offset voltage (FIGS. 5A-5B, references 504 and 514). The comparator output signal (Compout) is monitored by the offset control circuit 406 for the purpose of detecting a change in logic state (FIGS. 5A-5B, references 506 and 516). Such a change will occur when the adjusted current flowing the corresponding cascode circuit leg eliminates the offset voltage. If there is no change in logic state, then another iteration to increment the digital value of the multi-bit digital trimming signal (DataTrim) is performed to further increase the magnitude of the trim current Itrim and the logic state of the comparator output signal (Compout) is again monitored. This iterative process repeats as many times as necessary until the increased magnitude of the trim current Itrim is sufficient to eliminate the offset voltage as indicated by a detected change in logic state of the comparator output signal (Compout) (FIGS. 5A-5B, references 506 and 516). The digital value of the multi-bit digital trimming signal (DataTrim) at the point in time when the logic state of the comparator output signal (Compout)

changes state is saved by the offset control circuit 406 (FIGS. 5A-5B, references 508 and 518). As discussed above, following that change in logic state occurs, the calibration operation terminates (FIGS. 5A-5B, reference 510) and the circuit moves to the normal voltage to current conversion operation. The offset control circuit 406 then sets the digital value of the multi-bit digital trimming signal (DataTrim) to the saved digital value and the proper magnitude of the first or second trim current (Trim– or Trim+) is applied to the amplifier circuit 112 to correct for the voltage offset (FIGS. 5A-5B, reference 520).

Although described herein in the context of an improved operation voltage to current conversion circuit 100, it will be understood that the differential amplifier 112 with offset cancellation circuit 200 may be used in any circuit which requires or would benefit from an offset voltage calibrated amplifier.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
 a differential amplifier having a first input, a second input and an output;
 a calibration circuit configured to compensate for an offset voltage of the differential amplifier, said calibration circuit comprising:
  a shorting circuit configured to short the first and second inputs together and apply a calibration voltage to both the first and second inputs;
  wherein said differential amplifier outputs a digital signal in response to the applied calibration voltage having a logic state indicating whether said offset voltage is a positive or negative offset voltage; and
  an offset cancellation circuit receiving the digital signal and configured to progressively increment a magnitude of a first trim current applied to the differential amplifier to reduce the positive offset voltage if the digital signal has a first logic state and progressively increment a magnitude of a second trim current applied to the differential amplifier to reduce the negative offset voltage if the digital signal has a second logic state;
 a first transmission gate circuit coupled between the output of the differential amplifier and a control terminal of a transistor; and
 a second transmission gate circuit coupled between the output of the differential amplifier and an input of the offset cancellation circuit;
 wherein said first transmission gate circuit is turned off and said second transmission gate circuit is turned on when said shorting circuit shorts the first and second inputs together.

2. The circuit of claim 1, wherein said offset cancellation circuit is further configured to monitor for a change in logic state of the digital signal when progressively incrementing the magnitude and save a value of the magnitude when the change in logic state is detected.

3. The circuit of claim 2, wherein said shorting circuit is further configured to disconnect the first and second inputs, apply an input voltage to the first input and a feedback voltage to the second input, and wherein offset cancellation circuit is further configured to apply one of the first and second trim currents to the differential amplifier having a magnitude corresponding to the saved value.

4. The circuit of claim 1, wherein the offset cancellation circuit comprises:
 a digital-to-analog converter configured to generate an analog trim voltage in response to a digital trim signal;
 a voltage to current converter circuit configured to convert the analog trim voltage to a trim current; and
 a current steering circuit configured to steer the trim current for output as one of the first and second trim currents to the differential amplifier.

5. The circuit of claim 4, wherein said offset cancellation circuit further comprises a control circuit configured to increment the digital trim signal to cause the progressive increment of the magnitude of one of the first and second trim currents.

6. The circuit of claim 1, wherein the differential amplifier comprises:
 a first stage having a folded cascode circuit with a differential input coupled to said first and second inputs, a first cascode leg and a second cascode leg coupled to the differential input, and an output; and
 a second stage having a push-pull circuit with an input coupled to the output of the first stage;
 wherein said second trim current is applied to the first cascode leg and said first trim current is applied to the second cascode leg.

7. The circuit of claim 6, wherein said first cascode leg includes a first current source transistor coupled at a first node to a first cascode transistor and said second trim current is applied to said first node, and wherein said second cascode leg includes a second current source transistor coupled at a second node to a second cascode transistor and said first trim current is applied to said second node.

8. The circuit of claim 7, wherein said differential input includes a first input transistor and a second input transistor coupled as a differential input pair of transistors, and wherein said first input transistor is connected to the first node and the second input transistor is connected to the second node.

9. The circuit of claim 6, wherein said differential amplifier further includes a compensation capacitor, said compensation capacitor being disconnected when said shorting circuit shorts the first and second inputs together.

10. A method, comprising:
 shorting together a first and second inputs of a differential amplifier;
 applying a calibration voltage to both the first and second inputs;
 detecting a logic state of a digital signal generated at an output of the differential amplifier in response to the applied calibration voltage, said logic state indicating whether an offset voltage of the differential amplifier is a positive or negative offset voltage;
 if the digital signal has a first logic state, then progressively incrementing a magnitude of a first trim current applied to the differential amplifier to reduce the positive offset voltage;
 if the digital signal has a second logic state, then progressively incrementing a magnitude of a second trim current applied to the differential amplifier to reduce the negative offset voltage;
 generating a reference trim current; and steering the reference trim current for output as one of the first and second trim currents to the differential amplifier.

11. The method of claim 10, further comprising:
monitoring for a change in logic state of the digital signal when progressively incrementing the magnitude; and
saving a value of the magnitude when the change in logic state is detected.

12. The method of claim 11, further comprising:
disconnecting the first and second inputs;
applying an input voltage to the first input;
applying a feedback voltage to the second input; and
applying one of the first and second trim currents to the differential amplifier having a magnitude corresponding to the saved value.

13. The method of claim 10, further comprising incrementing a magnitude of the reference trim current to cause the progressive incrementing of the magnitude of one of the first and second trim currents.

14. A circuit, comprising:
a differential amplifier having a first input, a second input and an output;
a transistor having a control terminal and a conduction terminal;
a feedback path coupled between the conduction terminal and the second input;
a first transistor switch coupled between the first and second inputs;
a second transistor switch coupled between the feedback path and the second input;
a calibration circuit configured to:
turn on said first transistor switch and turn off said second transistor switch in a calibration mode;
apply a calibration voltage to both the first and second inputs, said differential amplifier outputs a digital signal in response to the applied calibration voltage having a logic state indicating whether said offset voltage is a positive or negative offset voltage;
progressively increment a magnitude of a first trim current applied to the differential amplifier to reduce the positive offset voltage if the digital signal has a first logic state; and
progressively increment a magnitude of a second trim current applied to the differential amplifier to reduce the negative offset voltage if the digital signal has a second logic state;
a first transmission gate circuit coupled between the output of the differential amplifier and the control terminal of said transistor;
a second transmission gate circuit coupled between the output of the differential amplifier and an input of the calibration circuit;
wherein said first transmission gate circuit is turned off and said second transmission gate circuit is turned on when in the calibration mode.

15. The circuit of claim 14, wherein said calibration circuit is further configured to:
monitor for a change in logic state of the digital signal when progressively incrementing the magnitude; and
save a value of the magnitude when the change in logic state is detected.

16. The circuit of claim 15, wherein said calibration circuit is further configured to:
turn off said first transistor switch and turn on said second transistor switch when calibration mode ends; and apply one of the first and second trim currents to the differential amplifier having a magnitude corresponding to the saved value.

17. The circuit of claim 14, wherein the differential amplifier comprises:
a first stage having a folded cascode circuit with a differential input coupled to said first and second inputs, a first cascode leg and a second cascode leg coupled to the differential input, and an output; and
a second stage having a push-pull circuit with an input coupled to the output of the first stage;
wherein said second trim current is applied to the first cascode leg and said first trim current is applied to the second cascode leg.

18. The circuit of claim 17, wherein said first cascode leg includes a first current source transistor coupled at a first node to a first cascode transistor and said second trim current is applied to said first node, and wherein said second cascode leg includes a second current source transistor coupled at a second node to a second cascode transistor and said first trim current is applied to said second node.

19. A circuit, comprising:
a differential amplifier having a first input, a second input and an output; and
a calibration circuit configured to compensate for an offset voltage of the differential amplifier, said calibration circuit comprising:
a shorting circuit configured to short the first and second inputs together and apply a calibration voltage to both the first and second inputs;
wherein said differential amplifier outputs a digital signal in response to the applied calibration voltage having a logic state indicating whether said offset voltage is a positive or negative offset voltage; and
an offset cancellation circuit receiving the digital signal and configured to progressively increment a magnitude of a first trim current applied to the differential amplifier to reduce the positive offset voltage if the digital signal has a first logic state and progressively increment a magnitude of a second trim current applied to the differential amplifier to reduce the negative offset voltage if the digital signal has a second logic state;
wherein the offset cancellation circuit comprises:
a digital-to-analog converter configured to generate an analog trim voltage in response to a digital trim signal;
a voltage to current converter circuit configured to convert the analog trim voltage to a trim current; and
a current steering circuit configured to steer the trim current for output as one of the first and second trim currents to the differential amplifier.

20. The circuit of claim 19, wherein said offset cancellation circuit further comprises a control circuit configured to increment the digital trim signal to cause the progressive increment of the magnitude of one of the first and second trim currents.

21. The circuit of claim 19, wherein said offset cancellation circuit is further configured to monitor for a change in logic state of the digital signal when progressively incrementing the magnitude and save a value of the magnitude when the change in logic state is detected.

22. The circuit of claim 21, wherein said shorting circuit is further configured to disconnect the first and second inputs, apply an input voltage to the first input and a feedback voltage to the second input, and wherein offset cancellation circuit is further configured to apply one of the first and second trim currents to the differential amplifier having a magnitude corresponding to the saved value.

23. A circuit, comprising:
a differential amplifier having a first input, a second input and an output; and
a calibration circuit configured to compensate for an offset voltage of the differential amplifier, said calibration circuit comprising:
a shorting circuit configured to short the first and second inputs together and apply a calibration voltage to both the first and second inputs;
wherein said differential amplifier outputs a digital signal in response to the applied calibration voltage having a logic state indicating whether said offset voltage is a positive or negative offset voltage; and
an offset cancellation circuit receiving the digital signal and configured to progressively increment a magnitude of a first trim current applied to the differential amplifier to reduce the positive offset voltage if the digital signal has a first logic state and progressively increment a magnitude of a second trim current applied to the differential amplifier to reduce the negative offset voltage if the digital signal has a second logic state;
wherein the differential amplifier comprises:
a first stage having a folded cascode circuit with a differential input coupled to said first and second inputs, a first cascode leg and a second cascode leg coupled to the differential input, and an output; and
a second stage having a push-pull circuit with an input coupled to the output of the first stage;
wherein said second trim current is applied to the first cascode leg and said first trim current is applied to the second cascode leg.

24. The circuit of claim 23, wherein said first cascode leg includes a first current source transistor coupled at a first node to a first cascode transistor and said second trim current is applied to said first node, and wherein said second cascode leg includes a second current source transistor coupled at a second node to a second cascode transistor and said first trim current is applied to said second node.

25. The circuit of claim 24, wherein said differential input includes a first input transistor and a second input transistor coupled as a differential input pair of transistors, and wherein said first input transistor is connected to the first node and the second input transistor is connected to the second node.

26. The circuit of claim 23, wherein said differential amplifier further includes a compensation capacitor, said compensation capacitor being disconnected when said shorting circuit shorts the first and second inputs together.

27. The circuit of claim 23, wherein said offset cancellation circuit is further configured to monitor for a change in logic state of the digital signal when progressively incrementing the magnitude and save a value of the magnitude when the change in logic state is detected.

28. The circuit of claim 27, wherein said shorting circuit is further configured to disconnect the first and second inputs, apply an input voltage to the first input and a feedback voltage to the second input, and wherein offset cancellation circuit is further configured to apply one of the first and second trim currents to the differential amplifier having a magnitude corresponding to the saved value.

29. A circuit, comprising:
a differential amplifier having a first input, a second input and an output;
a transistor having a control terminal and a conduction terminal;
a feedback path coupled between the conduction terminal and the second input;
a first transistor switch coupled between the first and second inputs;
a second transistor switch coupled between the feedback path and the second input; and
a calibration circuit configured to:
turn on said first transistor switch and turn off said second transistor switch in a calibration mode;
apply a calibration voltage to both the first and second inputs, said differential amplifier outputs a digital signal in response to the applied calibration voltage having a logic state indicating whether said offset voltage is a positive or negative offset voltage;
progressively increment a magnitude of a first trim current applied to the differential amplifier to reduce the positive offset voltage if the digital signal has a first logic state; and
progressively increment a magnitude of a second trim current applied to the differential amplifier to reduce the negative offset voltage if the digital signal has a second logic state;
wherein the differential amplifier comprises:
a first stage having a folded cascode circuit with a differential input coupled to said first and second inputs, a first cascode leg and a second cascode leg coupled to the differential input, and an output; and
a second stage having a push-pull circuit with an input coupled to the output of the first stage;
wherein said second trim current is applied to the first cascode leg and said first trim current is applied to the second cascode leg.

30. The circuit of claim 29, wherein said first cascode leg includes a first current source transistor coupled at a first node to a first cascode transistor and said second trim current is applied to said first node, and wherein said second cascode leg includes a second current source transistor coupled at a second node to a second cascode transistor and said first trim current is applied to said second node.

31. The circuit of claim 29, wherein said calibration circuit is further configured to:
monitor for a change in logic state of the digital signal when progressively incrementing the magnitude; and
save a value of the magnitude when the change in logic state is detected.

32. The circuit of claim 31, wherein said calibration circuit is further configured to:
turn off said first transistor switch and turn on said second transistor switch when calibration mode ends; and
apply one of the first and second trim currents to the differential amplifier having a magnitude corresponding to the saved value.

* * * * *